United States Patent [19]

Ferrari et al.

[11] 4,029,141

[45] June 14, 1977

[54] COOLING DEVICE FOR COMPONENTS WHICH DISSIPATE LARGE AMOUNTS OF HEAT

[75] Inventors: Alain Ferrari; Vito Suppa, both of Paris, France

[73] Assignee: Thomson-CSF, Paris, France

[22] Filed: Dec. 15, 1975

[21] Appl. No.: 640,912

[30] Foreign Application Priority Data

Dec. 17, 1974 France .................. 74.41523

[52] U.S. Cl. .................. 165/80; 361/385
[51] Int. Cl.² .................. F28F 3/08
[58] Field of Search .......... 165/80; 317/100; 357/82

[56] References Cited

UNITED STATES PATENTS

| 3,523,215 | 8/1970 | Steinmetz | 357/82 X |
| 3,768,548 | 10/1973 | Dilay | 165/80 X |

*Primary Examiner*—Alan Cohan
*Attorney, Agent, or Firm*—Oblon, Fisher, Spivak, McClelland & Maier

[57] ABSTRACT

A heat sink for components which dissipate large amounts of heat which enables operating temperatures to be held within predetermined limits.

This heat sink consists of a stack of connecting members (34, 38), cooling members (35, 37), "press pack" type components (36) and pressure members (33) which are arranged between two cross-pieces (21, 22) which are held together by ties (24, 25) to form an assembly frame.

The device is applicable in particular to the cooling of power thyristors.

2 Claims, 3 Drawing Figures

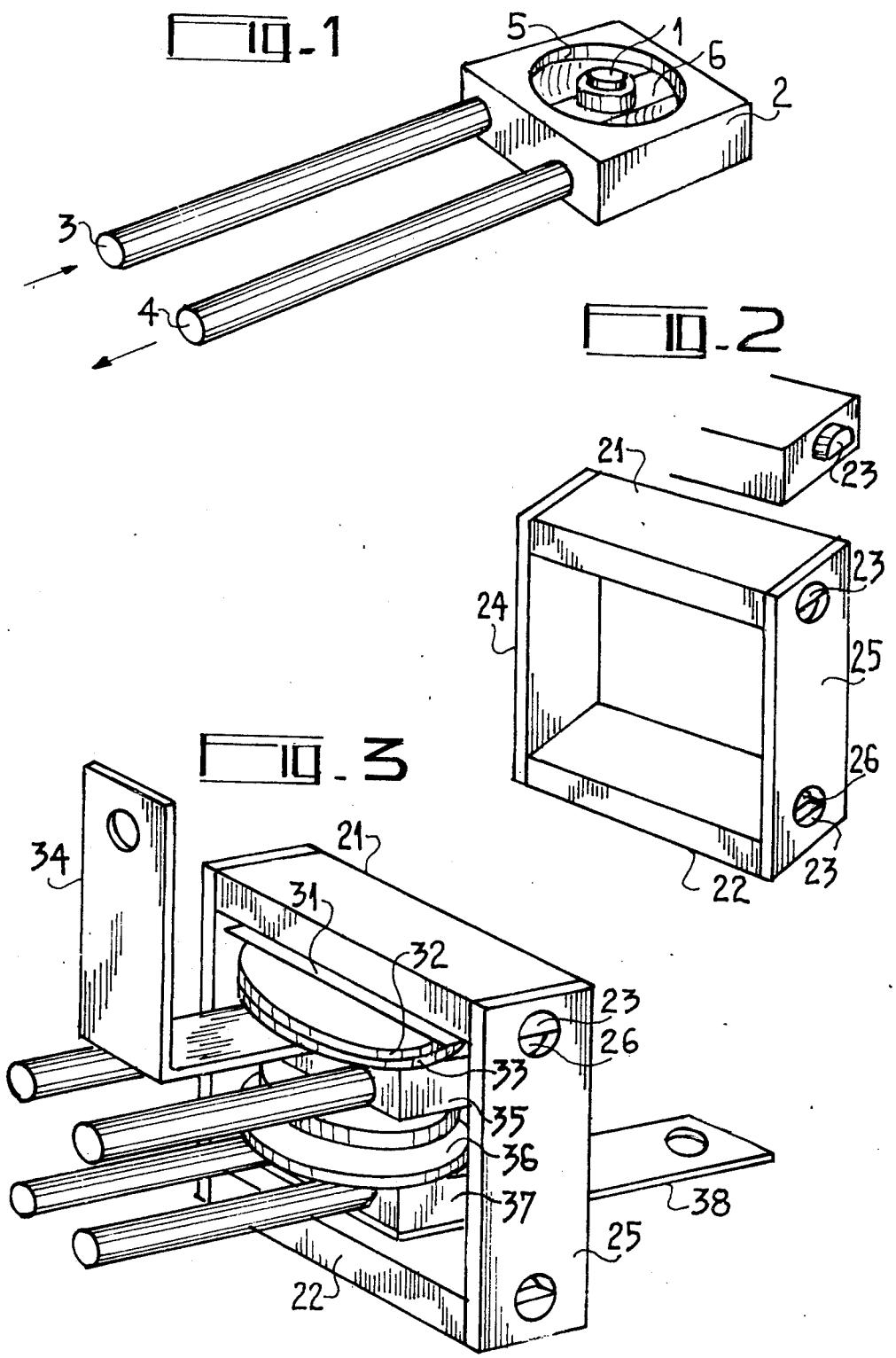

COOLING DEVICE FOR COMPONENTS WHICH DISSIPATE LARGE AMOUNTS OF HEAT

The present invention relates to cooling device for components which dissipate large amounts of heat. It relates in particular to a preferred construction of a cooling device comprising an assembly for cooling controlled-conduction components of the type known as a "press pack."

Each of the bases on either side of the central part of the component is cooled by a heat-sink through which a fluid is force-circulated.

One object of the present invention is to realize an improved embodiment of such a device which enables all threaded parts to be dispensed with and ensures that the circuits are sealed entirely without special packings or glands.

Other advantages of the invention which enables a preferred embodiment to be improved will become apparent from the following description, which is given by way of example, and is illustrated by the Figures, which show:

FIG. 1, a cooling device, in a kind of "pipe" configuration, through which there is a forced flow of a cooling liquid, FIG. 2, a frame for mechanically uniting a cooled assembly, which provides the pressure required to hold together the controlled conduction "press pack" components and the "pipes,"

FIG. 3, a complete assembly.

The cooling device, which resembles a pipe in shape, has a bearing face 1 in the center of its active portion which enables the flat surface of the base of the "press pack" component to be pressed firmly against the cooling device. This bearing face 1 is flush with the face of a parallelepiped block 2, in which block are inserted the fluid inlet and outlet ducts 3 and 4.

The material used for the heat sink is advantageously tinned copper. This metal has the advantage that it can be subjected to local cold-working around the periphery of a circular opening 5, thus sealing the cooling chamber 6 which is formed between a base of the press pack and the interior of the parallelepiped block 2.

FIG. 2 shows a collapsible assembly frame used to hold together an assembly of components. In FIG. 3, which shows a preferred embodiment, these components consist of, reading from top to bottom: an insulating plate 31, a flat metal pressure disc 32, a resilient metal disc 33, a lug 34 to conduct supply current, a first cooling "pipe" 35, a "press pack" controlled-conduction component 36, a second cooling "pipe" 37, and a further supply lug 38.

The assembly frame can be taken apart and consists of four metal parts, pairs of which are mutually identical, namely: two flat rectangular cross-pieces 21, 22 which are provided with semi-cylindrical studs 23 situated substantially in the middle of the small sides, and two ties 24, 25 of the same width as the cross-pieces which are pierced with pairs of circular openings 26 into which fit the studs 23 on assembly.

The assembly is effected with the help of a clamp or vise which clamps up all the components 21, 31 to 38, 22. Pressure from the jaws of the clamp or vise is applied to cross-pieces 21 and 22 to allow the openings 26 in ties 24, 25 to be fitted over the studs 23 on the corresponding cross-pieces. When the clamp or vise is slackened, resilient disc 33 relaxes and the assembly becomes self-adjusting. Any lack of parallelism which there may be between the various surfaces involved is accommodated by virtue of the resilience of the metal disc 33, the cold working of the bearing surfaces of the "pipes" and the freedom of the studs 23 on the cross-piece to rotate in openings 26 in the ties. Perfect seals are therefore formed at the joints between the "pipes" and the press pack component.

The device according to the present invention has the advantage of being of simple design both as regards manufacture and as regards the fitting and removal of the component, which is easily accessible.

It should be noted that the two cross-pieces 21 and 22 with their semi-cylindrical studs 23 may be produced by dividing a pre-machined part longitudinally into two equal portions.

What is claimed as new and desired to be secured by Letters Patent of the United States is:

1. A forced flow liquid heatsink assembly for cooling electrical components which dissipate large amounts of heat, comprising in a stacked relation:

a first horizontally disposed holding cross-piece (22);

an electrical current conducting lug (38) supported upon said first cross-piece;

a first cooling device (37) supported upon said conducting lug and having defined therein a heatsink which comprises inlet (3) and outlet (4) duct means for fluidically conducting a forced flow liquid coolant into and out of a first heatsink cooling chamber (6) which has an opening (5) defined within the top portion thereof;

at least one electrical component (36) of a press-pack type supported upon said first cooling device, the base or lower surface of said electrical component closing the opening (5) of said chamber and therefore being in direct contact with the liquid coolant within said first chamber;

a second cooling devide (35) supported upon the upper surface of said first electrical component and having defined therein a heatsink which comprises inlet (3) and outlet (4) duct means for fluidically conducting a forced flow liquid coolant into and out of a second heatsink cooling chamber (6) which has an opening (5) defined within the lower portion thereof, the upper surface of said electrical component closing said opening of said chamber of said second cooling device and therefore being in direct contact with the liquid coolant within said second chamber;

a second conductive supply lug (34) operatively connected to said second cooling device;

an assembly comprising a deformably resilient metal disc (33) cooperating with a pressure disc (32) and an insulating plate (31) supported upon said supply lug for imparting a spring-type biasing force to said stacked elements;

a second horizontally disposed holding cross-piece (21) disposed in contact with and supported upon the assembly formed by said resilient and pressure discs and said insulating plate;

the two cross-pieces at the opposite ends of the thus formed stack being assembled and held together by two vertically disposed ties (24, 25);

said cross-pieces being provided with stud members integrally provided therewith and projecting laterally from the opposite ends thereof; and said tie pieces are provided with apertures within the upper and lower ends thereof which are adapted to mate with said stud members of said cross-pieces; whereby said tie and crosspiece members form a simple collapsible framework for said heatsink assembly with the stacked components thereof compressedly restrained between said cross-pieces, and said stud members likewise compressedly maintained within said apertures of said tie members under the biasing force of said deformable resilient metal disc.

2. A heatsink assembly according to claim 1, wherein each of said heatsinks comprises:
a block (2) of a predetermined shape provided with a central or axial bearing face (1) which is flush with a face of said block and is surrounded by the walls of said heatsink defining said opening (5) of said cooling chamber (6) having said inlet and outlet ducts (3, 4).

* * * * *